United States Patent
Bentley et al.

(10) Patent No.: US 9,594,642 B1
(45) Date of Patent: Mar. 14, 2017

(54) ITERATIVE DECODE AND POST-DECODE MICROCODE CUT AND PASTE OPTIMIZATION

(71) Applicant: INTERNATIONAL BUSINESS MACHINES CORPORATION, Armonk, NY (US)

(72) Inventors: Steven R. Bentley, Tucson, AZ (US); Pamela R. Nylander-Hill, Tucson, AZ (US); Keisuke Tanaka, Tokyo (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/987,950

(22) Filed: Jan. 5, 2016

(51) Int. Cl.
G11C 29/00 (2006.01)
G06F 11/14 (2006.01)
G06F 3/06 (2006.01)
G06F 11/10 (2006.01)

(52) U.S. Cl.
CPC .......... *G06F 11/1451* (2013.01); *G06F 3/065* (2013.01); *G06F 3/0619* (2013.01); *G06F 3/0686* (2013.01); *G06F 11/106* (2013.01); *G06F 11/1435* (2013.01); *G06F 11/1464* (2013.01); *G06F 2201/84* (2013.01)

(58) Field of Classification Search
CPC . G11B 20/1833; G11B 2220/90; G11B 20/10; G11B 20/10009; H03M 13/15
USPC ........................................................ 714/771
See application file for complete search history.

(56) References Cited

U.S. PATENT DOCUMENTS

| | | | | |
|---|---|---|---|---|
| 4,271,519 A | * | 6/1981 | Hall | ......................... G11C 8/00 714/771 |
| 5,566,298 A | | 10/1996 | Boggs et al. | |
| 5,592,348 A | * | 1/1997 | Strang, Jr. | ............. G06F 3/0601 360/135 |
| 6,438,664 B1 | * | 8/2002 | McGrath | .................. G06F 9/24 711/102 |
| 2015/0179271 A1 | | 6/2015 | Nam et al. | |

OTHER PUBLICATIONS

IBM et al., "Pointer Collection and Reporting for Error Recovery Procedures Branching," An IP.com Prior Art Database Technical Disclosure, http://ip.com/IPCOM/000117898, Jul. 1, 1996 (5 pages).

* cited by examiner

*Primary Examiner* — Albert Decady
*Assistant Examiner* — Enam Ahmed
(74) *Attorney, Agent, or Firm* — Griffiths & Seaton PLLC

(57) ABSTRACT

Various embodiments for data error recovery in a tape storage system, by a processor device, are provided. In one embodiment, a method comprises, in a tape storage system using a hardware-initiated and microcode-initiated iterative decoder, initializing a microcode cut/paste algorithm on a buffered dataset by copying the buffered dataset to a reserved buffer segment; wherein the buffered dataset is a most corrected buffered dataset developed by at least one iterative decode cycle; and the buffered dataset, updated C1 data row error flags, and a correction status recovered by the at least one iterative decode cycle are cut and pasted over a working copy of a dataset resident in the reserved buffer segment.

21 Claims, 10 Drawing Sheets

US 9,594,642 B1

ITERATIVE DECODE AND POST-DECODE MICROCODE CUT AND PASTE OPTIMIZATION

BACKGROUND OF THE INVENTION

Field of the Invention

The present invention relates in general to computers, and more particularly to various embodiments for data error recovery in tape storage systems.

Description of the Related Art

In today's society, computer systems are commonplace. Computer systems may be found in the workplace, at home, or at school. Computer systems may include data storage systems, or disk storage systems, to process, store, and archive data. Large data archiving solutions typically use tape library systems where workstations and client devices are connected to one or more servers, and the servers are connected to one or more libraries. In data centers, such as those providing imaging for health care, entertainment, weather, military, and space exploration applications, these servers and libraries are often interconnected in a grid-computing environment.

SUMMARY OF THE DESCRIBED EMBODIMENTS

Various embodiments for data error recovery in a tape storage system, by a processor device, are provided. In one embodiment, a method comprises, in a tape storage system using a hardware-initiated and microcode-initiated iterative decoder, initializing a microcode cut/paste algorithm on a buffered dataset by copying the buffered dataset to a reserved buffer segment; wherein the buffered dataset is a most corrected buffered dataset developed by at least one iterative decode cycle; and the buffered dataset, updated C1 data row error flags, and a correction status recovered by the at least one iterative decode cycle are cut and pasted over a working copy of a dataset resident in the reserved buffer segment.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1A:
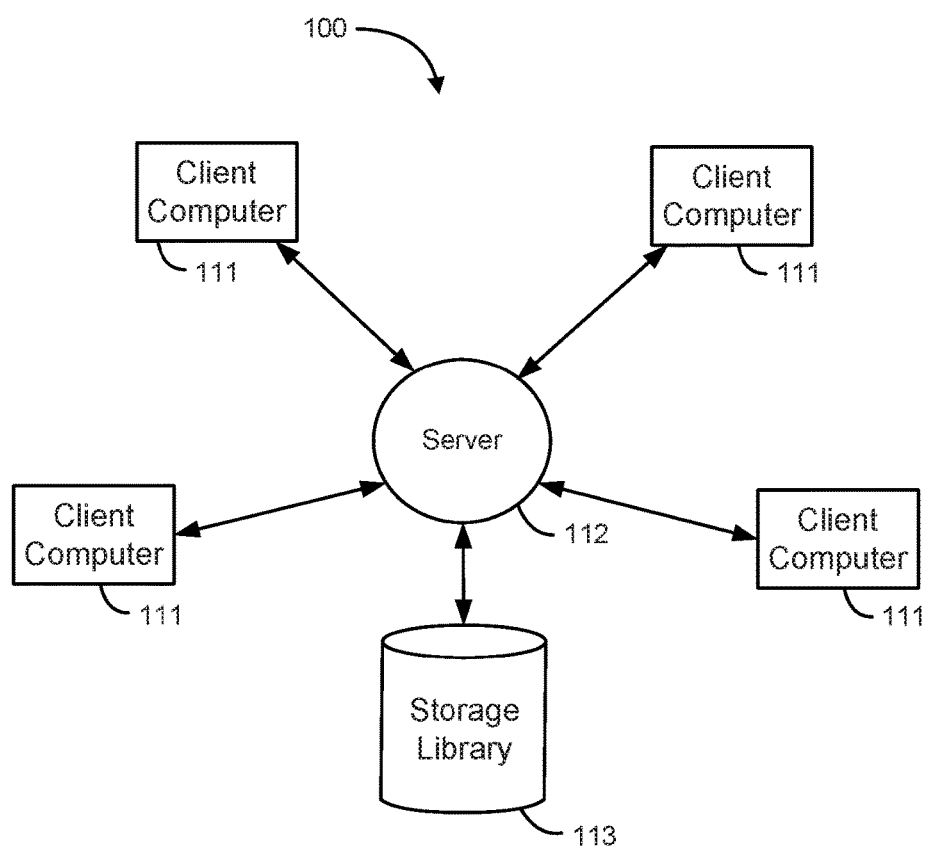
FIG. 1A is a block diagram illustrating a typical client-server library system for archiving data in which aspects of the invention can be implemented.

With increasing demand for faster, more powerful and more efficient ways to store information, optimization of storage technologies is becoming a key challenge, particularly in tape drives. In magnetic storage systems, data is read from and written onto magnetic recording media utilizing magnetic transducers commonly. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media. An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, magnetic tape is moved over the surface of the tape head at high speed. Usually the tape head is designed to minimize the spacing between the head and the tape. The spacing between the magnetic head and the magnetic tape is crucial so that the recording gaps of the transducers, which are the source of the magnetic recording flux, are in near contact with the tape to effect writing sharp transitions, and so that the read element is in near contact with the tape to provide effective coupling of the magnetic field from the tape to the read element.

Tape drives have conventionally used a servo system to keep the write/read heads in the correct lateral location on the tape. The difference between the correct location and actual location of the heads is referred to as position error signal (PES). Current servo systems implement a fixed threshold such that if the PES is larger than the threshold, the writing of the heads will be stopped to prevent overwriting of adjacent tracks. This threshold is referred to as the stopwrite (SW) threshold. However, it is difficult to pick the appropriate SW threshold due to the differences in distributions of PES data for different drives and/or different tapes. Another drawback is that when a particular predetermined SW threshold is used, the drive may write the data without any apparent error, when actually the adjacent tracks have been overwritten, rendering the data therein unreadable. This result is highly undesirable.

In data storage, error correction coding (ECC) is used to achieve very high data integrity. For example, magnetic tape storage products are designed to ensure bit error rates in the range of 10-17 to 10-20 under normal operating conditions. Linear block codes such as Reed-Solomon (RS) orthogonal codes and low-density parity-check (LDPC) codes are generally employed in data storage products. In optical and magnetic tape storage, powerful product codes are used to mitigate bad channel conditions that give rise to errors. Product codes allow the construction of very long block codes that are based on short constituent codes. The resulting product code is not the best possible long code for a given dimension and a given length. However, since the code is composed of smaller component block codes, the complexity of decoding product codes becomes manageable in practice.

Scaling tape systems to high areal densities results in a loss in signal to noise ratio of the read back signal that must be compensated by improvements in the head, media and data channel technologies. State-of-the-art linear tape recording systems employ product error-correction codes (ECC) that encode data in orthogonal two-dimensional arrays, where each row is an (N1,K1) Reed-Solomon (RS) code word referred to as a C1 code word and each column is an (N2,K2) RS code word referred to as a C2 code word.

ECC (C1 and C2) uncorrectable read errors are managed by microcode recovery algorithms. In order to correct the error, recovery strategies will backhitch and reposition to the failing dataset in order to reread it from tape using a range of speed, dataflow, servo, and channel settings. Dynamic channel calibrations and signal optimizations can also be performed at runtime to improve dataset error rate. Despite channel signal optimizations and servo control configurations, C1 and C2 correction as performed by a dataflow application-specific integrated circuit (ASIC) may not always resolve data in cases of high error rate. For example, in some approaches, C1-encoding is capable of correcting 10 bytes of error, and C2-encoding is capable of correcting 20 bytes of error. If the error bytes exceed this correction power, then data cannot be read from the tape. When conventional recovery strategies are insufficient to successfully read a dataset from media directly into the data buffer, then other recovery strategies can be used that focus on correcting a decoded dataset already resident in the data buffer. The decoded dataset can serve as input to a microcode recovery algorithm known as cut/paste, wherein that decoded dataset is copied by cut/paste logic to a reserved buffer segment which is repaired each read retry by sub-dataset comparison. The decoded dataset may also be input to an iterative decoder as implemented in the dataflow ASIC, wherein the dataflow performs multiple C2–C1 decodes as an error feedback loop. An optimal buffer data recovery strategy would combine both methodologies.

This cut and paste error recovery procedure (single and multi mode) is an effective method for providing error recovery, however requires time to complete. After each reread from media, microcode must analyze and compare each row of each sub-dataset with those of a working copy that is being optimized. Often, many rereads are required for microcode to successfully repair an adequate amount of sub-dataset rows such that C2 column correction may successfully decode the dataset. Backhitch and repositioning for reread accelerates head and media wear. In cases of error burst where many datasets in close proximity require recovery, extensive use of cut/paste recovery operations alone may reduce drive performance and potentially lead to command timeout scenarios.

In contrast, iterative decode as performed inline by dataflow is an efficient error correction mechanism which enables the dataflow to perform multiple C2–C1 decode iterations over a dataset already resident in the buffer. Each iterative decode cycle will update the C1 error flags in the buffer that are used by cut and paste algorithms iterative decode cycles may be hardware-initiated by default and microcode-initiated for recovery purposes. There is no requirement to reread data from tape. The iterative decode may be done at speed while the drive is still in motion or done once motion has stopped and the drive has repositioned back to the dataset in error.

Accordingly, in view of the foregoing, the present invention provides various embodiments for dataset error correction in tape storage systems. In one embodiment, in a tape storage system using an iterative hardware and microcode decoder, a microcode cut/paste algorithm is initialized on a buffered dataset, where a most corrected dataset recovered by one or more iterative decode cycles is copied to a reserved (working) buffer segment. Each reread of the dataset from tape will also undergo iterative decode of the buffered dataset, after which microcode does a C1-level comparison against the copy in the reserved buffer segment. Any C1 row improvements will be cut and pasted over those resident in the reserved buffer segment, as will be further described.

Turning now to the Figures, and in particular to FIG. 1A, there is depicted a block diagram of client-server library system 100 for archiving data in which aspects of the present invention may be implemented. The system 100 includes multiple client computers 111 from which data is transmitted to a server 112 for archiving in a data storage library 113. The client computers 111 also retrieve previously archived data from the library 113 through the server 112. Client computers 111 may be personal computers, portable devices (e.g., PDAs), workstations, or server systems, such as the IBM TS7720™. The client computers 111 may be connected to the server 112 through a local area network such as an Ethernet network, or by SCSI, iSCSI, Fibre Channel, Fibre Channel over Ethernet, or Infiniband. Server 112 may again be an IBM TS7740™ server, TS7720™ server, or other servers. Similarly, the data storage library 113 may be connected to the server 112 using a high data rate connection such as an optical or copper fiber channel, SCSI, iSCSI, Ethernet, Fibre Channel over Ethernet or Infiniband.

Figure 1B:
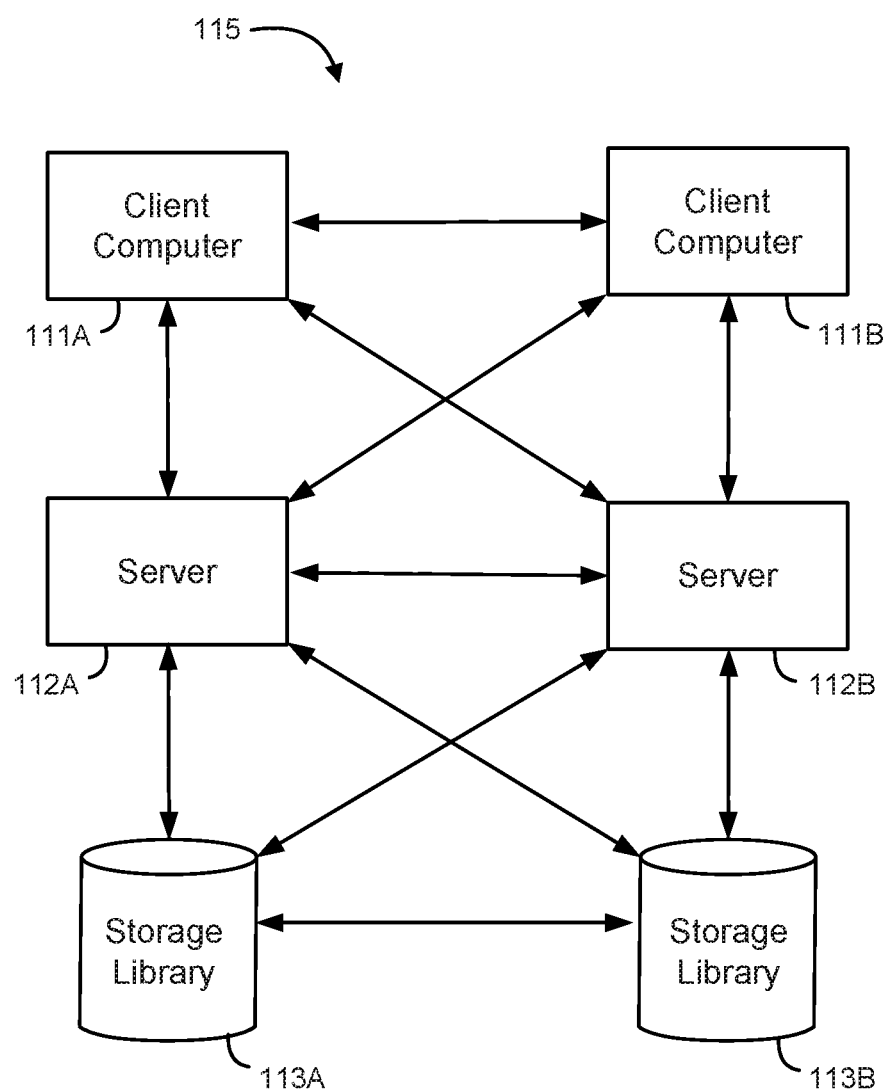
FIG. 1B is a block diagram illustrating a typical grid computing client-server library environment for archiving data in which aspects of the invention can be implemented.

FIG. 1B illustrates a block diagram of a typical grid computing library environment 115 for archiving data. The library environment 115 includes multiple client computers 111A and 111B interconnected to one another and to multiple server systems 112A and 112B. The server systems 112A and 112B are interconnected to one another and to multiple tape libraries 113A and 113B, which are also interconnected to one another.

Figure 2:
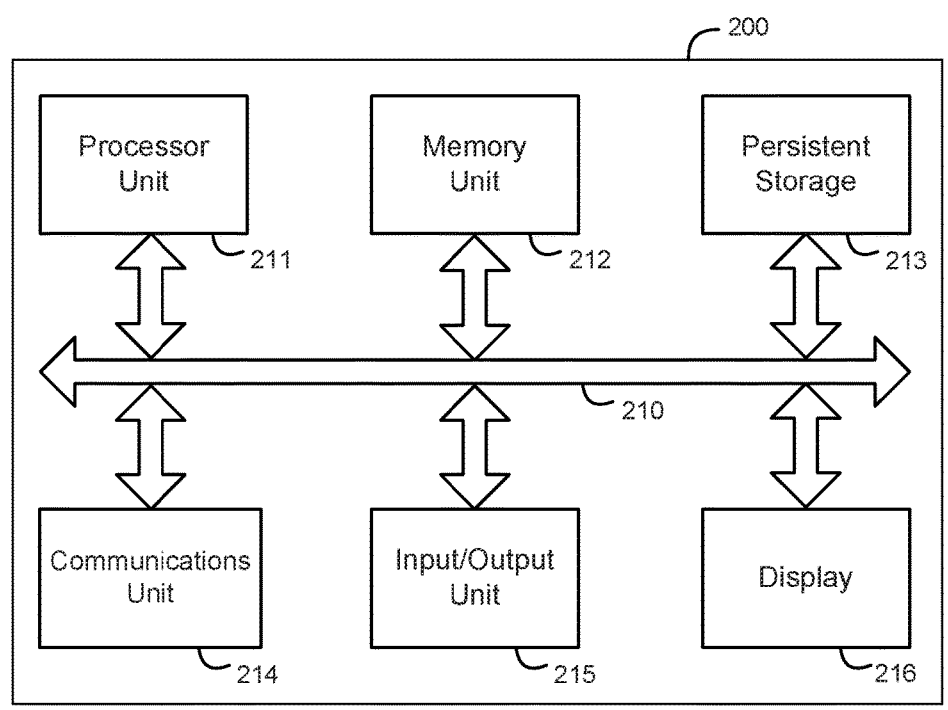
FIG. 2 is a block diagram illustrating a representative computer system which may be used as a client or a server computer.

FIG. 2 illustrates a block diagram of a data processing system that may be used as a client computer 111 or server system 112. As shown, a data processing system 200 includes a processor unit 211, a memory unit 212, a persistent storage 213, a communications unit 214, an input/output unit 215, a display 216 and a system bus 210. Computer programs are typically stored in the persistent storage 213 until they are needed for execution, at which time the programs are brought into the memory unit 212 so that they can be directly accessed by the processor unit 211. The processor unit 211 selects a part of memory unit 212 to read and/or write by using an address that the processor 211 gives to memory 212 along with a request to read and/or write. Usually, the reading and interpretation of an encoded instruction at an address causes the processor 211 to fetch a subsequent instruction, either at a subsequent address or some other address. The processor unit 211, memory unit 212, persistent storage 213, communications unit 214, input/output unit 215, and display 216 interface with each other through the system bus 210.

Figure 3:
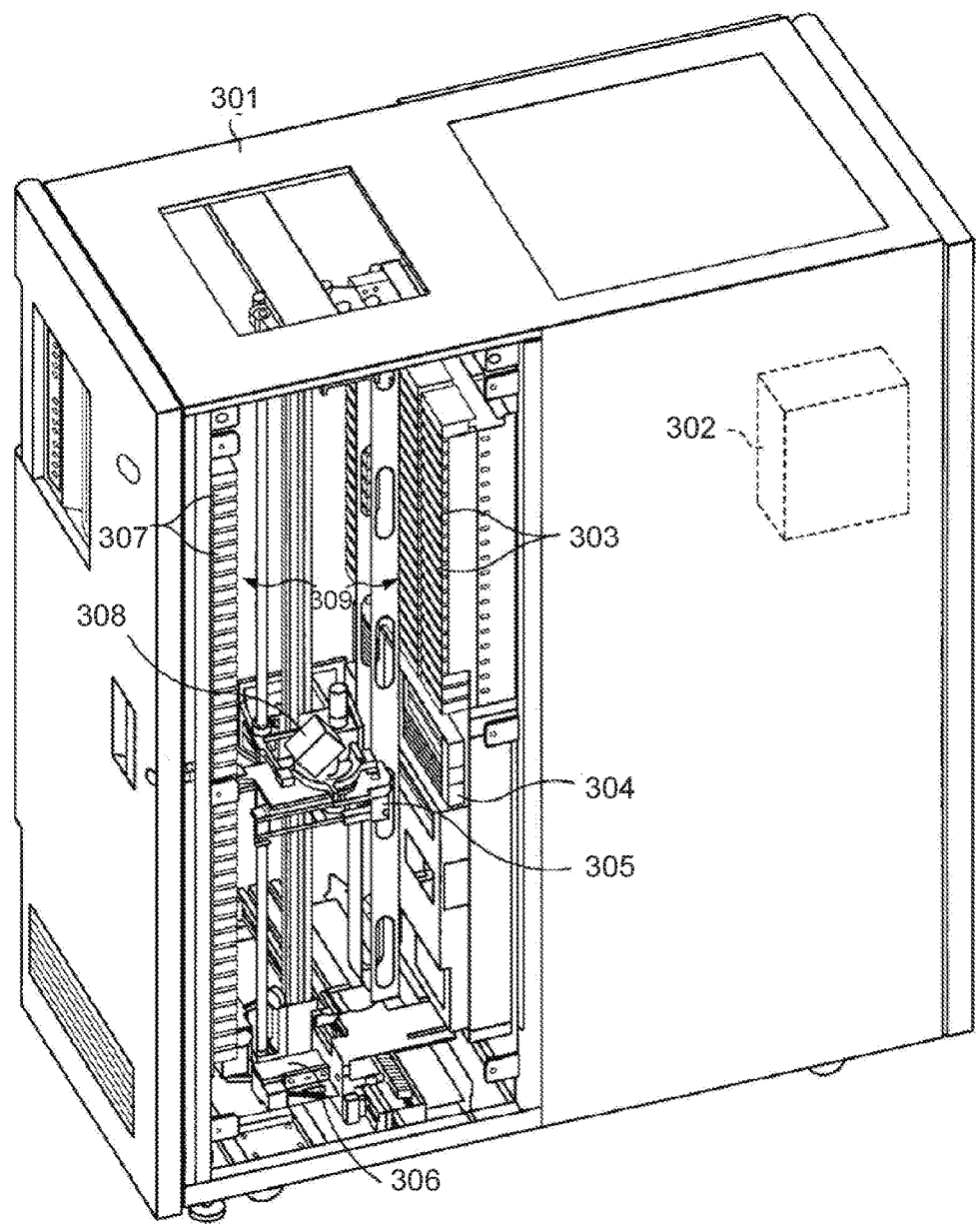
FIG. 3 illustrates a typical data storage tape library for archiving data in which aspects of the present invention may be implemented upon.

FIG. 3 illustrates an example of a data storage library 301 which may be found in an environment of an implementation of the present invention. The library 301 is an automated tape library that accommodates multiple tape drives 304 for reading and writing on tape media, such as single-reel or two-reel magnetic tape cartridges. Examples of the library 301 include IBM TS3400™ and TS3500™ Tape Libraries, IBM TotalStorage™ 3494 Tape Libraries, and IBM 3952™ Tape Frames Model C20, which store magnetic tape cartridges and use IBM TS1130™ tape drives. Other examples of the library 301 include IBM TS3310™ and TS3100/3200™ tape libraries which store magnetic tape cartridges and use IBM LTO (Linear Tape Open) tape drives. A plurality of tape media 303 are stored in banks or groups of storage slots 309. Tape media may encompass a variety of media, such as that contained in magnetic tape cartridges, magnetic tape cassettes, and optical tape cartridges, in various formats. For universal reference to any of these types of media, the terms "tape media" or "media" are used herein, and any of these types of containers are referred to as "tape cartridges" or "cartridges" herein. An access robot 306, including a cartridge picker 305 and a bar code reader 308 mounted on the picker, transports a selected cartridge 303 between a storage slot 309 and a drive 304.

The library 301 further has a library controller 302 which includes at least one microprocessor. The library controller 302 may serve to provide an inventory of the cartridges 303 and to control the library 301. Typically, the library controller 302 has suitable memory and data storage capability to control the operation of the library 301. The library controller 302 controls the actions of the access robot 306, cartridge picker 305, and bar code reader 308. The library controller 302 is interconnected through an interface to one or more host processors, which provides commands requesting access to particular tape media or to media in particular storage slots. A host, either directly, or through the library controller, controls the actions of the data storage drives 304. Commands for accessing data or locations on the tape media and information to be recorded on, or to be read from, selected tape media are transmitted between the drives 304 and the host. The library controller 302 is typically provided with a database for locating the tape cartridges 303 in the appropriate storage slots 309 and for maintaining the cartridge inventory.

Figure 4:
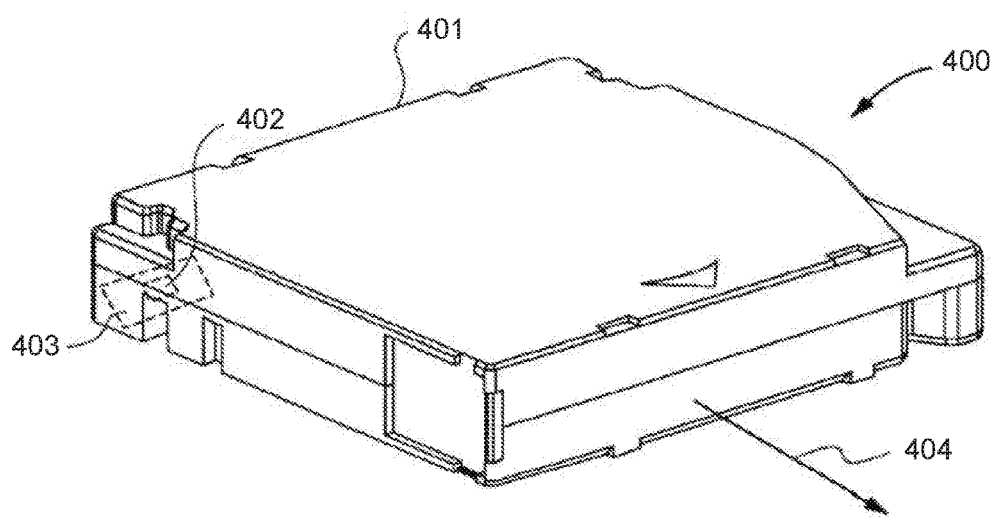
FIG. 4 illustrates an example of a tape cartridge media for use in the data storage tape library in FIG. 3.

FIG. 4 illustrates a perspective view of an exemplary tape cartridge 400 for use in a tape drive system 304 of FIG. 3, and fundamental to the present invention. The tape cartridge 400 has a reel (not shown) for holding tape media (not shown) which is wound around the reel hub. The tape cartridge 400 further includes an RFID cartridge memory 402 which is on printed circuit board 403, for wireless interfacing with the tape drive 304 and the cartridge picker 305. The tape cartridge 400 is referred to as a single-reel cartridge as it includes only one tape reel which acts as a supply reel during operation. A take-up reel is provided in the tape drive 304 for receiving the tape media when the tape media is being unspooled from the tape reel. In a different design of the tape drive 304, a take-up reel might be included in the cartridge 400 itself rather than in the tape drive 304. Such a tape cartridge is referred to as a dual-reel cartridge. Cartridge 400 is inserted along direction 404 into tape drive 304.

Figure 5:
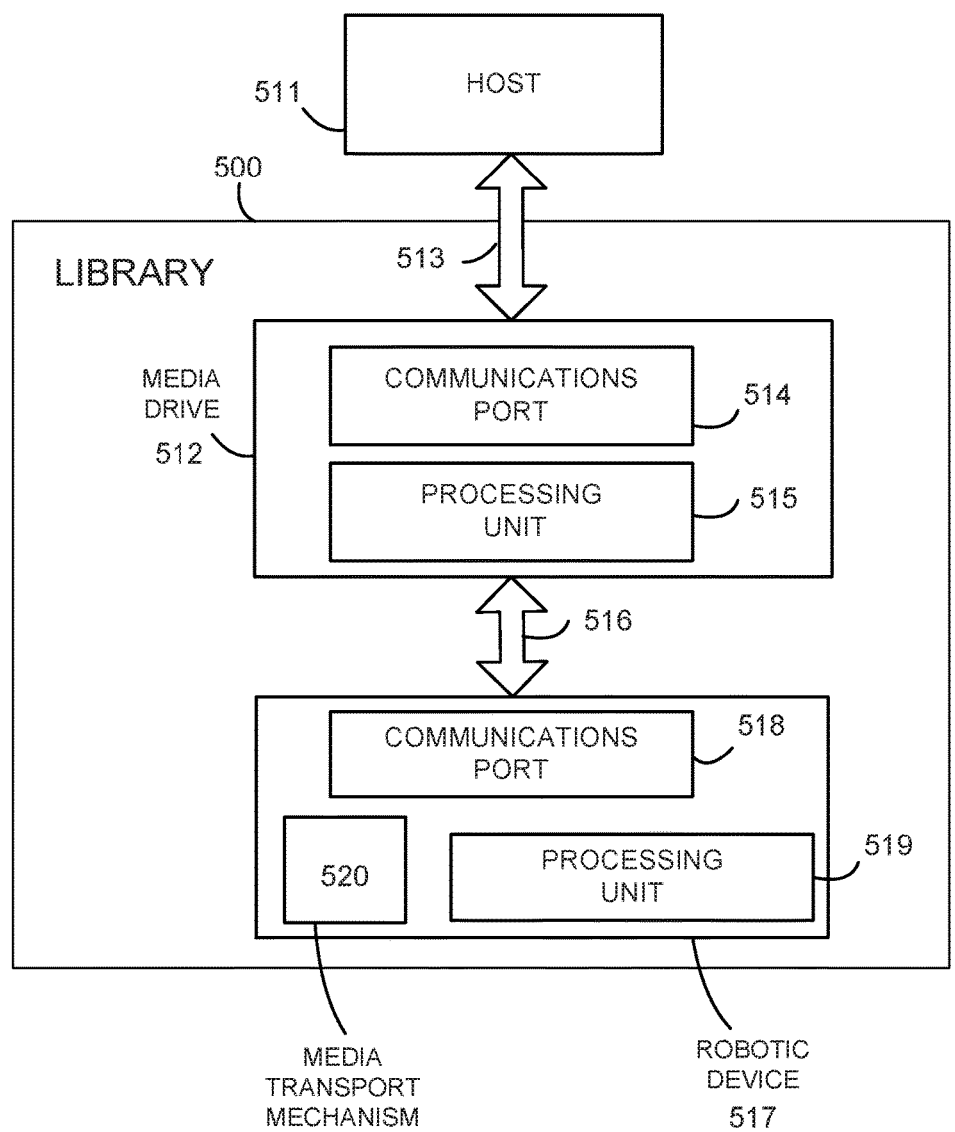
FIG. 5 illustrates a block diagram showing an exemplary data storage tape library in communication with a host computer for providing aspects of the invention.

FIG. 5 is a block diagram showing the functional components of an exemplary data storage tape library 500 in communication with a host computer 511 for providing aspects of the invention. The library 500 is attached to a host 511, and includes a media drive 512 and a robotic device 517. Data and control path 513 interconnects the host 511 and drive 512. Similarly, data and control path 516 interconnects the drive 512 and the robotic device 517. The paths 513 and 516 may comprise suitable means for conveying signals, such as a bus with one or more conductive members (such as wires, conductive traces, cables, etc.), wireless communications (such as radio frequency or other electromagnetic signals, infrared communications, etc.), and fiber optic communications. Furthermore, the paths 513 and 516 may employ serial, parallel, or another communications format, using digital or analog signals as desired. Communications with the media drive 512 and robotic device 517 are through communications ports 514 and 518, respectively.

Both the drive 512 and the robotic device 517 include respective processing units 515 and 519. The library 500 manages the positioning and access of removable or portable data storage media such as magnetic tape, cartridge 400, optical tape, optical disk, removable magnetic disk drive, CD-ROM, digital video disk (DVD), flash memory, or another appropriate format. Some of these types of storage media may be self-contained within a portable container, or cartridge. For universal reference to any of these types of storage media, this disclosure refers to them as media.

The host 511 may be a server, workstation, personal computer, or other means for exchanging data and control signals with the media drive 512. The drive 512 comprises a machine for reading data from and/or writing data to exchanging data with a portable data storage media. The robotic device 517 includes the processing unit 519 and a media transport mechanism 520 coupled to processing unit 519. The media transport mechanism 520 includes servos, motors, arms, grippers, sensors and other robotic, mechanical and electrical equipment to perform functions that include (at least) the transportation of media items between the drive 512, various storage bins (not shown), import/export slots, etc. The mechanism 520 may, for example, comprise an auto-loader mounted to the drive 512, a robotic arm housed inside a mass storage library, or another suitable device. As an example, the mechanism 520 may comprise an access robot 306, cartridge picker 305 and bar code reader 308 from FIG. 3.

Figure 6:
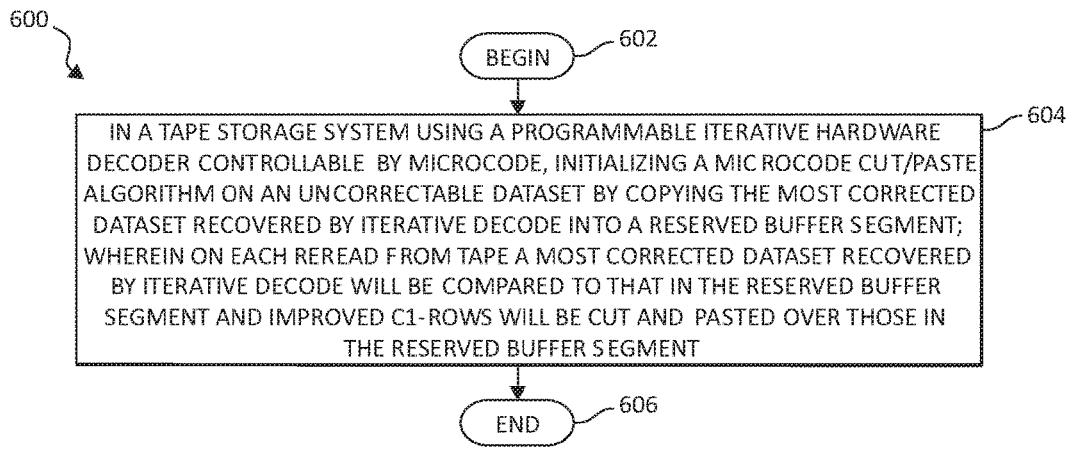
FIG. 6 illustrates a flow chart of a method for data error recovery in tape storage systems according to aspects of the present invention.

Continuing to FIG. 6, a flow chart diagram illustrating an exemplary method 600 for data error recovery in a tape storage system, among other aspects of the illustrated embodiments, is depicted. As aforementioned the method 600 may be performed in accordance with the present invention in any of the environments depicted in FIGS. 1-5, among others, in various embodiments. Of course, more or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

Beginning (step 602), in a tape storage system using a programmable iterative hardware decoder controllable by microcode, initializing a microcode cut/paste algorithm on an uncorrectable dataset by copying the most corrected dataset recovered by iterative decode into a reserved buffer segment; where a most corrected dataset recovered by iterative decode will be compared to that in the reserved buffer segment and improved C1 data rows will be cut and pasted over those in the reserved buffer segment (step 604). The method ends (606).

Figure 7A:
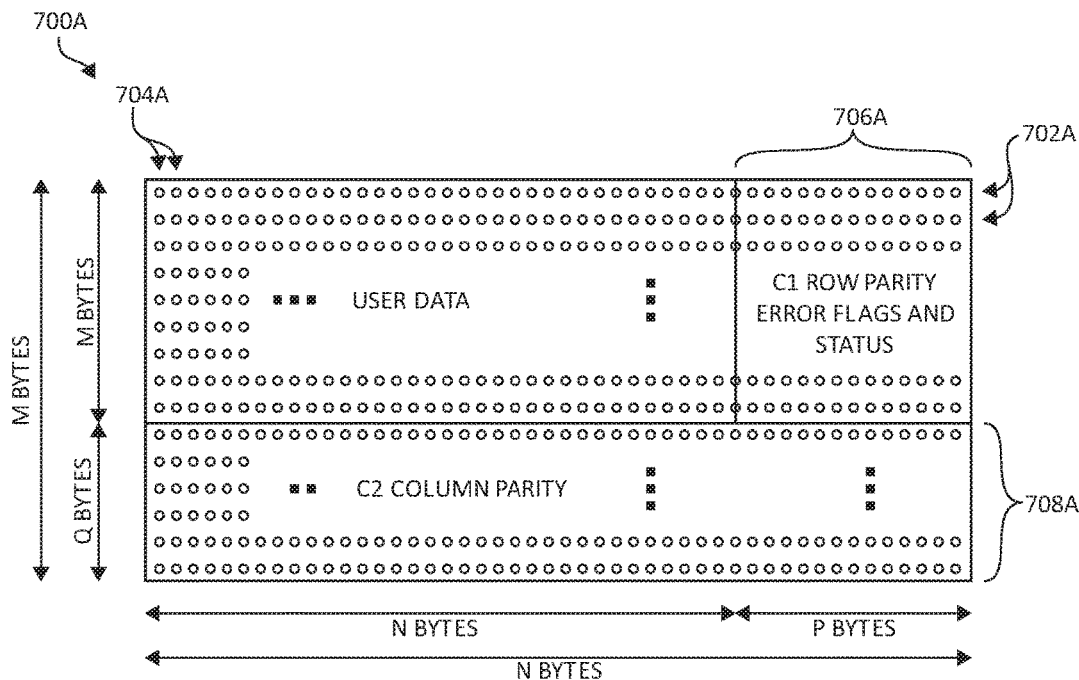
FIG. 7A illustrates a block diagram of a 2-way error correction encoding (ECC) coded data sub-dataset according to aspects of the present invention.

As aforementioned, tape and optical storage devices use very powerful error correction codes, such as product codes or concatenated codes, in conjunction with interleaving to provide a very high degree of data integrity. When a tape drive reads data from a tape, or when a tape drive writes data to a tape, a unit of data that is read or written is referred to as a "dataset." The dataset is encoded using interleaved sets of codewords that are organized into an ECC-encoded matrix of size M bytes×N bytes (M×N) and then written to tape as shown in FIG. 7A. There are two levels of encoding within this matrix 700A. The first level of encoding utilizes the matrix rows 702A. Each row 702A of the matrix contains C1-ECC row parity 706A, which adds p-bytes of C1-ECC to the n-bytes of user data (e.g., N=n+p bytes). The second level of encoding, C2-ECC column parity 708A, adds q-bytes of C2-ECC to each matrix column 704A. For example, if q=12, then adding 12 bytes of C2-ECC would add 12 rows to the matrix 700A (e.g., M=m+q bytes).

Iterative decoding enables a dataflow to perform multiple C2–C1 decode iterations over a dataset already read from tape and resident in a data buffer. In this way, no reread of data is required to improve dataset decode results. A limited number of hardware-initiated and microcode-initiated iterative decode cycles may be performed while tape is at speed (the drive is still in motion) and one or more microcode-initiated iterative decode cycles performed once motion has stopped and the drive has repositioned back to the dataset in error. Each microcode-initiated iterative decode cycle builds on the correction improvement of a previous cycle. The iterative decoder engine will also update the correction status and flags in the data buffer to reflect the most recent cycle. Either the dataset in the buffer becomes correctable or a correction status converges to a "no improvement" state and/or exceeds a predetermined error correction threshold limit. If still uncorrectable, microcode recovery algorithms may proceed to initiate a cut/paste algorithm and/or reread data from tape into the data buffer and then repeat the iterative decode process.

This repeated, or iterative, decode may be configured to be performed by dataflow logic a limited number of times while tape is moving before data buffer throughput and host performance are affected. It can be the case that one or more hardware-initiated and one or more microcode-initiated decode cycles can be completed before the buffer performance threshold is met. The number of allowed iterative decodes while tape is in motion is governed primarily by tape speed, but other criteria may apply. Once beyond such a threshold, tape motion must stop and a dataset will enter into data recovery under microcode control. For example, m number of hardware-initiated iterative decode cycles and n number of microcode iterative decode cycles may be initiated before stopping the tape due to buffering. Following a backhitch, further iterative decode action on the buffered dataset may be initiated by microcode in order to improve dataset correction as much as feasible. For example, x number of microcode iterative decode cycles may be initiated while the tape is stopped, until it is determined there is no longer any correction improvement, and/or a predetermined error correction threshold is reached. Microcode iterative decode operates on a dataset image that is stored in DRAM, so no reread is involved. If the dataset is able to be corrected with further invocations of iterative decode by microcode, it significantly reduces head wear and possible tape damage involved with multiple backhitches normally required to reread data from tape.

At this point, the iterative decode's "best" corrected dataset has refreshed the C1 error status and flags in the buffer, but cannot improve correction further without a reread from tape. In the context of iterative decode, this best corrected dataset will be discarded from the buffer on the next reread retry and replaced by a next best corrected dataset which could have been read with a different set hardware settings and speed. Without the inclusion of the microcode cut/paste recovery method, the best corrected dataset history across multiple retries is lost. The microcode cut/paste error recovery algorithm may then leverage every "best" corrected dataset developed by iterative decode along with the "best" refreshed C1 error flags and status to more effectively improve microcode's working copy of the dataset in the reserved buffer segment. The two methods work in tandem to lessen recovery time, lessen performance impacts by using iterative decode while tape is still in motion, and reduce the head and media wear associated with repeated backhitch for dataset reread from tape.

The microcode cut/paste algorithm uses a divided data buffer, organized as a ring buffer. One dataset is associated with one buffer segment. Data is read from tape into normal buffer segments. When an uncorrectable read dataset is detected, microcode will make a copy of it to a reserved buffer segment. In legacy drives, microcode will compare the newly read dataset to the reserved copy and make C1 repairs to each sub-dataset of the reserved copy. Once correctable, the cut/paste segment is copied back to the normal segment and recovery terminates successfully. Legacy cut/paste recovery is dependent on improved quality and error rate as a result of rereading data using different dataflow, servo, speed, and channel settings.

Cut/paste recovery has two operating modes: single cut/paste and multi cut/paste. The best corrected dataset from iterative decode is used in the same manner for both modes, the difference being the number of datasets being managed by ERP in the same recovery session. Normally, microcode error recovery is focused on a single dataset, such that failed recovery attempts will immediately cause a backhitch/reposition to set up for a next reread from tape of that single dataset. This is generally the default operating mode for ERP until microcode error recovery becomes involved with managing bursts of errors. An error burst is defined as a thresholded number of datasets in close proximity that require error recovery. If a dataset error is recoverable with many retries (many iterations of ERP), the next data set may presumably require similar retries to successfully read the data. All this recovery causes the tape drive to take a long time to read data due to the multiple backhitches necessary to reread the data from the tape, which degrades host performance and can also cause head and media wear by localized and repetitive motion often required of single cut/paste. To reduce this impact, Multi cut/paste mode allows the drive to reread the error dataset (DS) #N under recovery as well as the next M datasets before backhitch and reposition. While tape is in motion, one or more iterative decode cycles may be performed by hardware and microcode on the error dataset #N as well as the next M datasets also being read.

Once tape motion is stopped, beginning with dataset #N and continuing through dataset #N+M, microcode has the option to continue with one or more iterative decode cycles until the dataset becomes correctable or until no more progress can be made. Then cut/paste optimization of the best corrected dataset including updated C1 error flags and status is performed against the working dataset copy maintained in a reserved buffer segment, and any improved C1-rows detected in the best corrected dataset are then copied into the reserved buffer segment. When DS#N becomes readable, all the forward datasets are also checked. In the case where DS#N through DS#N+2 are readable but DS#N+3 is not, then DS#N-N+2 will all recover simultaneously. Multi cut/paste recovery will then restart at DS#N+3 in the same manner. Multi cut/paste mode lessens start/stop motion, but still depends on the quality of the reread dataset and correction improvement by iterative decode.

Figure 7B:
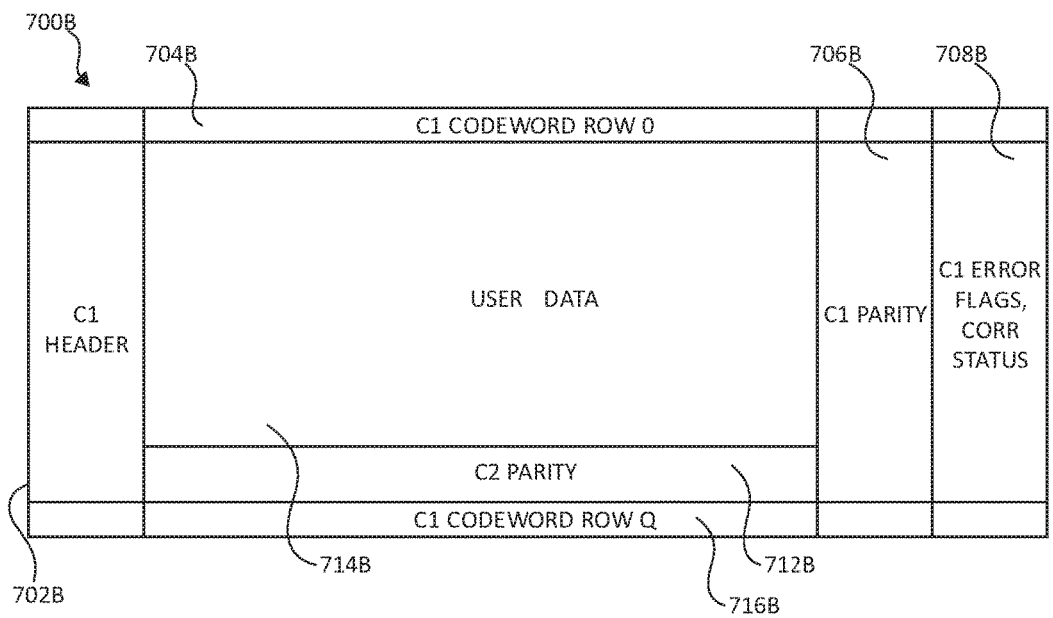
FIG. 7B illustrates an additional block diagram of a 2-way error correction coded (ECC) encoded data sub-dataset according to aspects of the present invention.

Cut/paste repair is performed on each sub-dataset of the dataset. A sub-dataset has Q-rows of 4-way interleaved C1 codewords. Each sub-dataset row has: header information including write pass number and dataset number, C1 error correction flags and correction status including correctable/uncorrectable indicators, and C1 corrected bytes. FIG. 7B illustrates a block diagram of this 2-way error correction encoding (ECC) encoded data sub-dataset 700B.

Depicted are examples of that discussed above, including a C1 header 702B, 4-way interleaved C1 codeword row-0 704B, C1 row parity data 706B, C1 error correction status indicators and error flags 708B, C2 parity data 712, user data 714B, and 4-way interleaved C1 codeword row-Q 716B.

In one embodiment, the cut/paste algorithm performs a C2-check first on the best corrected dataset developed by iterative decode. The C1-row set of error flags and correction status are now updated and improved from the set that came into the buffer on initial media reread. Any correctable sub-datasets (via initial read or subsequent retry) will not be repaired. Instead they are copied as is to the reserved buffer segment. Following reread, a validation that each sub-dataset C1 row belongs to dataset under recovery is performed. C1-correction of each row of each uncorrectable sub-dataset (media-reread vs reserved buffer copy) are compared. The C1 sub-dataset rows of the reserved buffer copy are then overwritten with media C1 sub-dataset rows if: the media-read sub-dataset row is C1-correctable with a corrected byte count less than that of reserve copy and/or media-read row and reserve copy row are both C1-uncorrectable.

Figure 8:
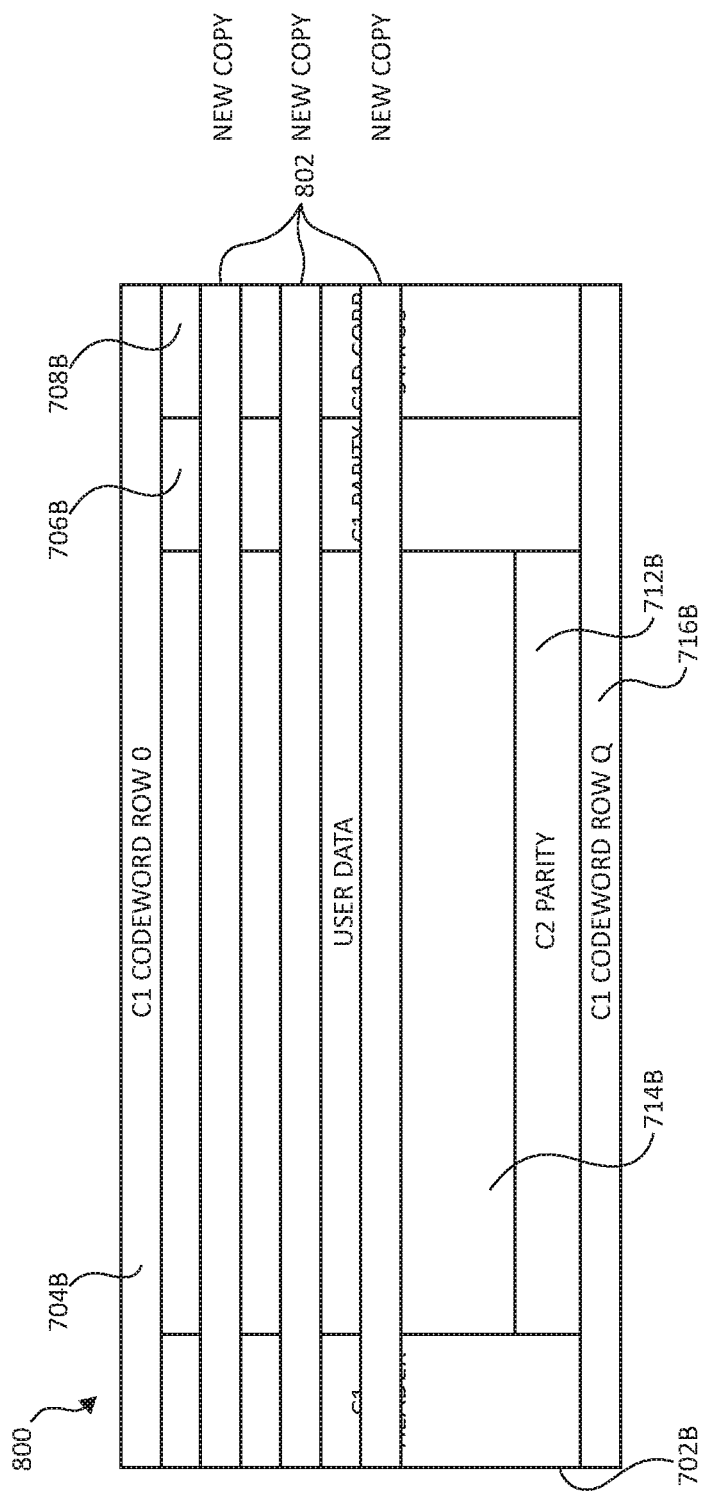
FIG. 8 illustrates block diagram of the data sub-dataset of FIG. 7B having undergone a microcode cut/paste operation according to aspects of the present invention.

FIG. 8 illustrates block diagram of the data subset of FIG. 7B having undergone one or more iterative decode cycles and a microcode cut/paste operation 800. Depicted are a C1 header 702B, 4-way interleaved C1 codeword row-0 704B, C1 parity data 706B, C1 error flags and correction status indicators 708B, C2 parity data 712B, user data 714B, and 4-way interleaved C1 codeword row-Q 716B, and as aforementioned, once the repaired reserve copy dataset becomes correctable upon a C2-check, it is copied back to the normal buffered dataset, as shown by pasted new copies 802. This describes single Cut/Paste mode. Multi-Cut/Paste mode would repeat the same action on the error dataset #N and each of the N+M datasets (as required) which follow in the forward direction.

As aforementioned, read microcode error recovery focuses on correction of an uncorrectable dataset just read from tape. Each dataset is associated with one buffer segment, such that a dataset may be identified by buffer segment number. Actions dealing with iterative decode in tandem with the cut/paste algorithm are summarized:

In one embodiment, once data is read into the buffer from tape and while tape is still moving, the dataflow performs one or more hardware-initiated iterative decode cycles against the buffered dataset at speed without microcode intervention, although this number has been pre-configured by microcode prior to the read. It is feasible at slow speeds for the microcode to initiate one or more additional iterative decode cycles while tape is still moving. This recovery action depends on a measured impact to host performance and code complexity. Each completed iterative decode cycle will update the C1 error flags and correction status in the buffer.

If the dataset is still uncorrectable, in order to continue or initiate microcode error recovery, the drive will be stopped and a backhitch-reposition will occur. Following reposition, microcode will read status registers from the dataflow which contains a sub-dataset C2 uncorrectable error status (UE) status and an accumulated C2 correction count (CORCNT). Microcode retrieves and monitors this status as derived by dataflow integrated circuit ASIC logic at completion of the iterative decode cycle to determine if correction is continuing to improve or if correction is converging to a "no improvement" state. This convergence metric used by microcode to cease requesting further iterative decode, but until that condition is met, microcode may request any number of iterative decode cycles while tape motion is stopped. The number of cycles may be determined by a predetermined error correction threshold value, learned error patterns, or other criteria.

If the dataset becomes correctable following the one or more iterative decode cycles, then recovery will terminate successfully without any reread of data from tape or invocation of the microcode cut and paste algorithm.

If still uncorrectable, the cut/paste algorithm then has available the "best" (most corrected) dataset achieved through one or multiple iterative decode cycles as well as the "best" set of error flags and correction status. Not only does the potential of much-improved C1-C2 decode exist over that decode as initially read from tape, but the refreshed error correction flags and pointers in the buffer will be leveraged by the cut/paste algorithm to more effectively repair the reserved copy. Since the reserved copy is no longer a sequence of repairs from a buffered dataset read directly from tape, but instead a sequence of repairs from a buffered dataset with history of best correction by interative decode, the potential to recover a dataset with fewer retries is significantly higher. This is especially true in areas of tape where the error rate is high due to media damage, marginally written data, data written in older formats, poor head read channel performance, etc.

Consider the scope of iterative decode as correction improvements to a dataset resident in the data buffer. The cut/paste algorithm recalls and leverages this optimization by merging improved C1 rows into the reserved copy of the dataset resident in the reserved buffer segment. In this way, the reserved copy is corrected as a result of multiple rereads from tape whose correction has been optimized within the data buffer by iterative decode, such that iterative decode history is not lost between retries. When performed in tandem with the cut/paste algorithm, this greatly increases data error recovery and reduces the accompanying recovery time.

When the cut/paste algorithm cannot resolve the errors, then microcode will reread DS #n (and subsequent N+M datasets if in multi-cut/paste mode) from tape following application of parameter changes from a variety of configuration characteristics, including, but not limited to: dataflow, servo, channel, speed and repositioning options.

In cases of error burst, datasets in close proximity are involved in error recovery. Even if read retry counts are low given improved correction by using iterative decode, an error burst may still occur and lead to excessive backhitch which can damage tape and increase overall recovery time. To address this, a readahead strategy of multi cut/paste mode is adopted where read retry over DS#n allows forward motion to continue until n+m datasets have been read from media and moved into the data buffer.

Iterative decode in tandem with the cut/paste algorithm is then applied to the initial error segment and all forward segments, providing improvements in overall error rate by leveraging the cut/paste algorithm with combined iterative decode. This allows the drive to move across the defective area of tape in larger steps and with fewer backhitches.

Figure 9:
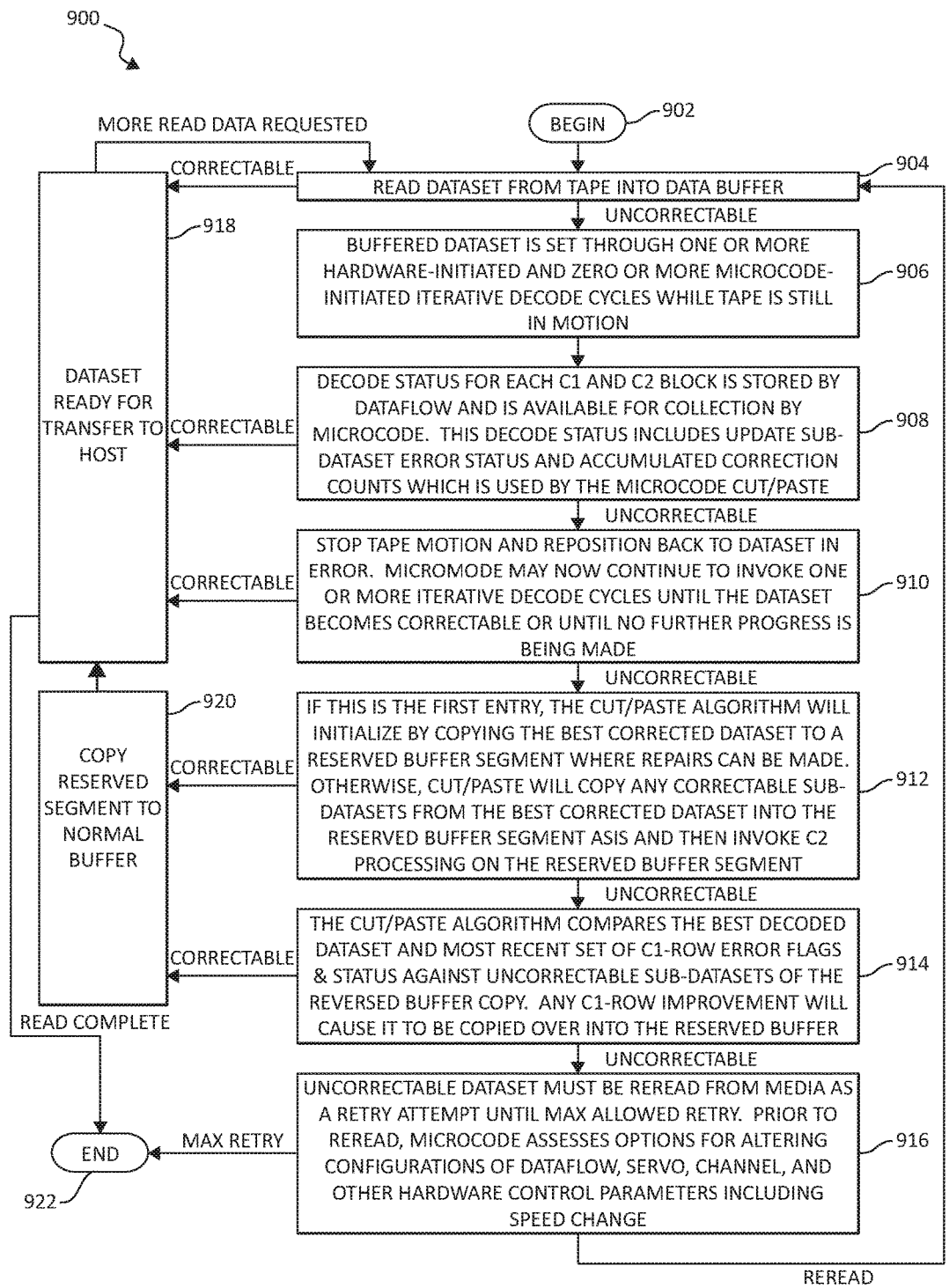
FIG. 9 illustrates an additional flow chart of a method for data error recovery in tape storage systems according to aspects of the present invention.

FIG. 9 illustrates an additional flow chart of a method 900 for data error recovery in tape storage systems in review of the mechanisms of the present invention. As aforementioned the method 900 may be performed in accordance with the present invention in any of the environments depicted in FIGS. 1-5, among others, in various embodiments. Of course, more or less operations than those specifically described in FIG. 9 may be included in method 900, as would be understood by one of skill in the art upon reading the present descriptions.

Each of the steps of the method 900 may be performed by any suitable component of the operating environment. For example, in various embodiments, the method 900 may be partially or entirely performed by a processor, or some other device having one or more processors therein. The processor, e.g., processing circuit(s), chip(s), and/or module(s) implemented in hardware and/or software, and preferably having at least one hardware component may be utilized in any device to perform one or more steps of the method 900. Illustrative processors include, but are not limited to, a central processing unit (CPU), an application specific integrated circuit (ASIC), a field programmable gate array (FPGA), etc., combinations thereof, or any other suitable computing device known in the art.

Beginning (step 902), a dataset is read from tape into a data buffer (step 904). If the data does not need correction, the dataset is ready for transfer to the host (step 918), the read is complete, and the method ends (step 922). If, at step 904, the data is uncorrectable, the buffered dataset is sent through one or more hardware-initiated iterative decode cycles and zero or more microcode-initiated iterative decode cycles while the tape is still in motion (step 906). If the data is now correctable, the dataset is ready for transfer to the host (step 918), the read is complete, and the method ends (step 922).

A decode status for each C1 and C2 block is stored by the dataflow and available for collection by microcode. The decode status includes sub-dataset error status and accumulated error correction counts which are used by the microcode cut/paste algorithm (step 908). If the data is now correctable, the dataset is ready for transfer to the host (step 918), the read is complete, and the method ends (step 922).

Continuing from step 908, if the dataset is still uncorrectable, the tape motion is stopped and the tape is repositioned back to the dataset in error. Microcode then continues to invoke one or more iterative decode cycles until the dataset becomes correctable or until conversion metrics indicate no further progress is being made, as determined by a predetermined error correction threshold (step 910). If the data is now correctable, the dataset is ready for transfer to the host (step 918), the read is complete, and the method ends (step 922).

Continuing from step 910, during a first retry, the microcode cut/paste algorithm initializes by copying the best corrected dataset to a reserved buffer segment where repairs to the dataset are performed. Otherwise, the microcode cut/paste algorithm copies any correctable sub-datasets from the best corrected dataset into the reserved buffer segment asis at which time C2 data row correction processing is invoked on the reserved buffer segment (step 912). If the dataset is now correctable, the reserved buffer segment is copied to the normal working buffer (step 920), the dataset is ready for transfer to the host (step 918), the read is complete, and the method ends (step 922).

Continuing from step 912, if the dataset is still uncorrectable, the microcode cut/paste algorithm compares the best decoded dataset and most recent set of C1 data row error flags and status registers against uncorrectable sub-datasets of the reserved buffer copy, at which point any C1 data row improvement will be copied to the reserved buffer segment (step 914). If the dataset is now correctable, the reserved buffer segment is copied to the normal working buffer (step 920), the dataset is ready for transfer to the host (step 918), the read is complete, and the method ends (step 922).

Continuing from step 914, if the dataset is still uncorrectable, the dataset must be reread from the tape media as a retry attempt until a maximum number of allowed retries are reached, as determined by a predetermined threshold. Prior to the reread attempt, microcode assesses options for altering configurations of dataflow, servo, channel, and other hardware control parameters including speed changes (step 916). If the maximum number of read retries has not been reached, the method begins anew at step 904. If the predetermined threshold of the maximum number of allowed retries has been reached, the method ends (step 922).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for data error recovery in a tape storage system, by a processor device, comprising:
  in a tape storage system using a hardware-initiated and microcode-initiated iterative decoder, initializing a microcode cut/paste algorithm on a buffered dataset by copying the buffered dataset to a reserved buffer segment;
  wherein the buffered dataset is a most corrected buffered dataset developed by at least one iterative decode cycle; and
  the buffered dataset, updated C1 data row error flags, and a correction status recovered by the at least one iterative decode cycle are cut and pasted over a working copy of a dataset resident in the reserved buffer segment.

2. The method of claim 1, further including initializing the at least one iterative decode cycle on the buffered dataset when an uncorrectable read error occurs; and
  for a next iterative decode cycle, building upon data corrections obtained in a previous iterative decode cycle by leveraging the microcode cut/paste algorithm to copy improved portions of the buffered dataset onto the dataset resident in the reserved buffer segment.

3. The method of claim 2, further including initializing the at least one iterative decode cycle on the buffered dataset until a predetermined error correction threshold is reached.

4. The method of claim 3, further including, upon reaching the predetermined error correction threshold, initializing the microcode cut/paste algorithm on the buffered dataset by initially copying the buffered dataset into the reserved buffer segment for iterative repair.

5. The method of claim 1, further including refreshing, by a dataflow application-specific integrated circuit (ASIC), the C1 data row error flags in the buffered dataset for use by the microcode cut/paste algorithm for correction improvement of the dataset resident in the reserved buffer segment; and
  indicating, by the ASIC, merging of correctable sub-datasets of the buffered dataset into the reserved buffer segment without modification after n subsequent rereads from tape.

6. The method of claim 5, further including merging C1 data rows of the buffered dataset into the dataset resident in the reserved buffer segment as a repair action; and
  preserving iterative decode history via the merging of the C1 data rows of the buffered dataset into the dataset resident in the reserved buffer segment, the merged C1 data rows comprising a most corrected copy.

7. The method of claim 5, further including, upon a determination that the buffered dataset remains uncorrectable, rereading the data of the buffered dataset from the tape;
  wherein at least one of a plurality of read configuration characteristics is changed pursuant to the reread.

8. A system for data error recovery in a tape storage system, comprising:
  at least one processor device, wherein the at least one processor device:
    in a tape storage system using a hardware-initiated and microcode-initiated iterative decoder, initializes a microcode cut/paste algorithm on a buffered dataset by copying the buffered dataset to a reserved buffer segment;
      wherein the buffered dataset is a most corrected buffered dataset developed by at least one iterative decode cycle; and
      the buffered dataset, updated C1 data row error flags, and a correction status recovered by the at least one iterative decode cycle are cut and pasted over a working copy of a dataset resident in the reserved buffer segment.

9. The system of claim 8, wherein the at least one processor device initializes the at least one iterative decode cycle on the buffered dataset when an uncorrectable read error occurs; and
  for a next iterative decode cycle, builds upon data corrections obtained in a previous iterative decode cycle by leveraging the microcode cut/paste algorithm to copy improved portions of the buffered dataset onto the dataset resident in the reserved buffer segment.

10. The system of claim 9, wherein the at least one processor device initializes the at least one iterative decode cycle on the buffered dataset until a predetermined error correction threshold is reached.

11. The system of claim 10, wherein the at least one processor device, upon reaching the predetermined error correction threshold, initializes the microcode cut/paste algorithm on the buffered dataset by initially copying the buffered dataset into the reserved buffer segment for iterative repair.

12. The system of claim 8, wherein the at least one processor device refreshes, by a dataflow application-specific integrated circuit (ASIC), the C1 data row error flags in the buffered dataset for use by the microcode cut/paste algorithm for correction improvement of the dataset resident in the reserved buffer segment; and
  indicates, by the ASIC, merging of correctable sub-datasets of the buffered dataset into the reserved buffer segment without modification after n subsequent rereads from tape.

13. The system of claim 12, wherein the at least one processor device merges C1 data rows of the buffered dataset into the dataset resident in the reserved buffer segment as a repair action; and
  preserves iterative decode history via the merging of the C1 data rows of the buffered dataset into the dataset resident in the reserved buffer segment, the merged C1 data rows comprising a most corrected copy.

14. The system of claim 12, wherein the at least one processor device, upon a determination that the buffered dataset remains uncorrectable, rereads the data of the buffered dataset from the tape; wherein at least one of a plurality of read configuration characteristics is changed pursuant to the reread.

15. A computer program product for data error recovery in a tape storage system by at least one processor device, the computer program product embodied on a non-transitory computer-readable storage medium having computer-readable program code portions stored therein, the computer-readable program code portions comprising:
  an executable portion that, in a tape storage system using a hardware-initiated and microcode-initiated iterative decoder, initializes a microcode cut/paste algorithm on a buffered dataset by copying the buffered dataset to a reserved buffer segment;
    wherein the buffered dataset is a most corrected buffered dataset developed by at least one iterative decode cycle; and
    the buffered dataset, updated C1 data row error flags, and a correction status recovered by the at least one iterative decode cycle are cut and pasted over a working copy of a dataset resident in the reserved buffer segment.

16. The computer program product of claim 15, further comprising an executable portion that initializes the at least one iterative decode cycle on the buffered dataset when an uncorrectable read error occurs; and for a next iterative decode cycle, builds upon data corrections obtained in a previous iterative decode cycle by leveraging the microcode cut/paste algorithm to copy improved portions of the buffered dataset onto the dataset resident in the reserved buffer segment.

17. The computer program product of claim 16, further comprising an executable portion that initializes the at least one iterative decode cycle on the buffered dataset until a predetermined error correction threshold is reached.

18. The computer program product of claim 17, further comprising an executable portion that, upon reaching the predetermined error correction threshold, initializes the microcode cut/paste algorithm on the buffered dataset by initially copying the buffered dataset into the reserved buffer segment for iterative repair.

19. The computer program product of claim 15, further comprising an executable portion that refreshes, by a dataflow application-specific integrated circuit (ASIC), the C1 data row error flags in the buffered dataset for use by the microcode cut/paste algorithm for correction improvement of the dataset resident in the reserved buffer segment; and indicates, by the ASIC, merging of correctable sub-datasets of the buffered dataset into the reserved buffer segment without modification after n subsequent rereads from tape.

20. The computer program product of claim 19, further comprising an executable portion that merges C1 data rows of the buffered dataset into the dataset resident in the reserved buffer segment as a repair action; and preserves iterative decode history via the merging of the C1 data rows of the buffered dataset into the dataset resident in the reserved buffer segment, the merged C1 data rows comprising a most corrected copy.

21. The computer program product of claim 19, further comprising an executable portion that, upon a determination that the buffered dataset remains uncorrectable, rereads the data of the buffered dataset from the tape; wherein at least one of a plurality of read configuration characteristics is changed pursuant to the reread.

\* \* \* \* \*